(12) United States Patent
Chang et al.

(10) Patent No.: US 6,916,526 B1
(45) Date of Patent: Jul. 12, 2005

(54) BIAXIALLY ORIENTED POLYPROPYLENE METALLIZED FILM FOR PACKAGING

(75) Inventors: Keunsuk P. Chang, North Kingstown, RI (US); Scott Narkevicius, Wakefield, RI (US); Kevin S. Kitchin, Richmond, RI (US)

(73) Assignee: Toray Plastics (America), Inc., N. Kingstown, RI (US)

( * ) Notice: Subject to any disclaimer, the term of this patent is extended or adjusted under 35 U.S.C. 154(b) by 73 days.

(21) Appl. No.: 09/715,013

(22) Filed: Nov. 20, 2000

Related U.S. Application Data

(60) Provisional application No. 60/219,011, filed on Jul. 19, 2000.

(51) Int. Cl.[7] .............................. B32B 7/02; B32B 7/12; B32B 15/04; B32B 15/08
(52) U.S. Cl. ...................... 428/220; 428/212; 428/349; 428/457; 428/461
(58) Field of Search ................................ 428/212, 516, 428/349, 461, 35.2, 457, 220

(56) References Cited

U.S. PATENT DOCUMENTS

| | | | |
|---|---|---|---|
| 4,297,187 A | | 10/1981 | Deguchi et al. |
| 4,345,005 A | | 8/1982 | All et al. |
| 5,137,955 A | * | 8/1992 | Tsuchiya et al. ............ 524/310 |
| 5,492,741 A | * | 2/1996 | Akao et al. ................. 428/213 |
| 5,698,317 A | | 12/1997 | Kurokawa et al. |
| 5,939,205 A | * | 8/1999 | Yokoyama et al. ...... 264/235.8 |
| 5,998,039 A | * | 12/1999 | Tanizaki et al. ........... 428/34.9 |
| 6,033,786 A | | 3/2000 | Fatica et al. |
| 6,106,933 A | * | 8/2000 | Nagai et al. ................. 428/212 |
| 6,139,930 A | * | 10/2000 | Comer et al. ............... 428/141 |
| 6,218,017 B1 | * | 4/2001 | Yamashita et al. .......... 428/141 |
| 2003/0082390 A1 | * | 5/2003 | Chang ........................ 428/457 |

OTHER PUBLICATIONS

A. Yializis et al., 1997 "Barrier Degradation in Aluminum Metallized Polypropylene Films" Society of Vacuum Coaters 505/856–7188, pp 371–375.

F. Casey et al., 1999 "Properties of Metallized Film in a Free Span Web Metallizer" Society of Vacuum Coaters 505/856–7188, pp 480–483.

U. Moosheimer et al., 1999 "Permeation of Oxygen and Moisture Through Vacuum Web Coated Films" Society of Vacuum Coaters 505/856–7188, pp 408–414.

J. Specht, 1998 "Metallization: An End–User's Perspective" Society of Vacuum Coaters 505/856–7188, pp 440–445.

Y. Leterrier et al. 1998 "Durability of Thin PECVD $SiO_x$ Coatings of Polymer Films" Society of Vacuum Coaters 505/856–7188, pp 429–433.

* cited by examiner

*Primary Examiner*—Rena Dye
*Assistant Examiner*—Lawrence Ferguson
(74) *Attorney, Agent, or Firm*—Morrison & Foerster LLP

(57) ABSTRACT

A laminate film comprising a polyolefin resin layer having a discharge-treated surface on one side of the polyolefin resin layer comprising at least 0.3% nitrogen functional groups on the discharge-treated surface; and a metal layer having an optical density of at least about 2.6 deposited on the discharge-treated surface of the polyolefin resin layer has a barrier durability under 9% elongation of 46.5 cc/m²/day or less oxygen transmission rate through the laminate film.

42 Claims, 1 Drawing Sheet

BIAXIALLY ORIENTED POLYPROPYLENE METALLIZED FILM FOR PACKAGING

RELATED APPLICATIONS

Figure 1A:
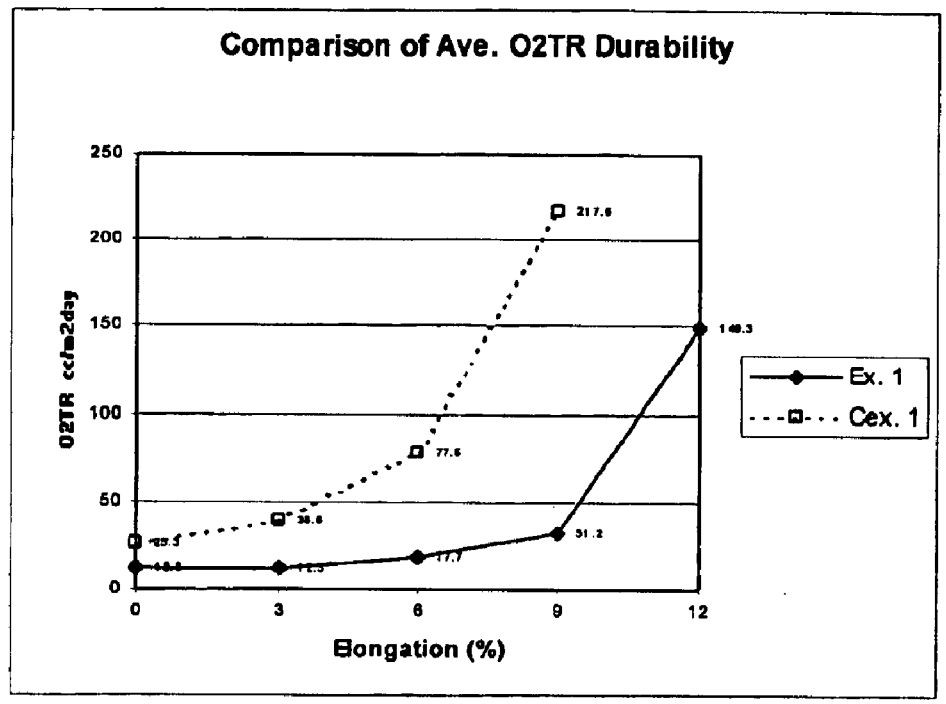

This application claims priority from Provisional Application Ser. No. 60/219,011 filed Jul. 19, 2000, entitled "BIAXIALLY ORIENTED POLYPROPYLENE METALLIZED FILM FOR PACKAGING," the entire disclosure of which is hereby incorporated herein by reference.

FIELD OF INVENTION

This invention relates to a metallized polypropylene film containing a polyolefin layer and a metal deposited layer, and a method of making the same.

BACKGROUND OF INVENTION

Biaxially oriented polypropylene metallized films are used for many packaging applications, particularly in food packaging, because they have important sealing and protective qualities. The films minimize the amount of light, moisture, and oxygen which can normally enter an ordinary, unprotected package. The films are often used in food packaging in combination with gas-flushing applications to protect the contents from moisture and oxidation. Also, the films often provide a heat sealable inner layer for bag forming and sealing.

Metallized films used in vertical-form-fill-seal (VFFS) packaging provides an excellent barrier in both unlaminated or laminated forms. However, because of the wide variety of forming collars used, bag sizes, filling speeds, and machine tensions used during the process of bag-forming, the laminated packaging containing the metallized film can be stretched in the packaging machine from 5 to 10% beyond the dimensions of the original film packaging. This stretching may cause fracture or cracks to form in the metal layer of the film. As a result, the packaging loses its protective properties. For instance, oxygen can readily pass through a damaged packaging film and cause unwanted oxidation of the contents.

High barrier metallized OPP films are typically metallized to an optical density range of 2.0–2.4. This has been shown to be adequate to provide good flat sheet (unelongated) barrier properties. However, such an optical density level has not been shown to provide good barrier durability during the bag forming process.

U.S. Pat. No. 5,698,317, the disclosure of which is incorporated herein by reference, discloses the use of a four layer packaging film having a polyolefin resin layer sandwiched between a polyolefin mixed resin layer comprising a petroleum or terpene resin and a heat sealable layer or non-sealable winding layer. A metal layer is then deposited on the surface of the polyolefin mixed resin layer. The metal layer is deposited following the discharge treatment of the polyolefin mixed resin layer.

U.S. Pat. No. 4,297,187, the disclosure of which is incorporated herein by reference, discloses the use of a discharge treatment method on a plastic surface in a controlled atmosphere comprised of $N_2$ and $CO_2$.

The present invention improves upon the moisture and gas barrier properties as well as the durability of the metal layer.

SUMMARY OF THE INVENTION

This invention provides a method to improve the flat sheet barrier and barrier durability of conventional metallized films resulting in a metallized high barrier packaging film with good formed bag barrier properties. The invention helps solve the problem of leaky bags associated with conventional metallized film packaging and the bag-forming process by providing a metal layer with an optical density of at least about 2.6. The metal layer is deposited on a polymer laminate film having at least two layers, a polyolefin resin layer and a heat sealable or a non-heat sealable, winding layer. The invention improves upon the moisture and gas barrier properties of laminate films.

The laminate film of the invention includes at least a 1, 2 or 3-layer coextruded film and a metal layer, preferably a vapor deposited aluminum layer, with at least an optical density of about 2.6, preferably with an optical density of about 2.6 to 4, and even more preferably between 2.8 and 3.2. The high optical density aluminum layer is vapor deposited upon a discharge treated surface, preferably a discharge-treatment produced in a $CO_2$ and $N_2$ environment. Such discharge-treatment in a $CO_2/N_2$ atmosphere results in a treated surface containing at least 0.3% nitrogen-containing functional groups, and preferably at least 0.5% nitrogen-containing functional groups. In the case of the 2-layer laminate, the laminate film comprises a polymer resin, preferably a homopolymer polypropylene resin which has been discharge treated in the preferred method. In the case of a 3-layer laminate, the metal vapor is deposited upon a discharge treated surface (via the preferred method) containing a polyolefin mixed resin. This polyolefin mixed resin layer is disposed on one side of a homopolymer propylene core layer. A heat sealable surface or a winding surface containing antiblock and/or slip additives for good machinability and low coefficient of friction (COF) is disposed on the opposite side of the propylene core layer. Additionally, if the third layer is used as a winding surface, its surface may also be modified with a discharge treatment to make it suitable for laminating or converter applied adhesives and inks.

DETAILED DESCRIPTION OF THE INVENTION

In one embodiment of the invention the laminate film comprises: a polyolefin resin layer, preferably a resin containing polypropylene; a heat sealable layer or a non-heat sealable, winding layer; and a metal layer. The polyolefin resin layer will have a thickness of about 6 to 40 μm thick. The polyolefin resin layer is discharge treated, and the metal layer deposited on the treated resin layer. The discharge treatment is preferably conducted in an atmosphere of $N_2$ or a mixture of $CO_2$ and $N_2$, more preferably in a mixture of $CO_2$ and $N_2$. This method of discharge treatment results in a treated surface that comprises 0.3% or more in atomic % of the surface of nitrogen-bearing functional groups, preferably 0.5% or more nitrogen in atomic %.

The metal layer is preferably a vapor deposited metal, more preferably vapor deposited aluminum. The metal layer shall have a thickness between 5 and 100 nm, preferably between 50 and 80 nm, more preferably between 60 and 70 nm; and an optical density between 2.6 and 5.0, preferably between 2.6 and 4.0, more preferably between 2.8 and 3.2.

Analysis of the metal layer in the most preferred embodiment by X-ray photoelectron spectroscopy (XPS)/Electron Spectroscopy for Chemical Analysis (ESCA) depth profiling using a 3 kV $Ar^+$ beam reveals a unique structure not seen in a lower optical density metal layer (less than 2.6). The high optical density metal layer deposition results in several distinct strata within the metal layer. First, a relatively thin outside layer of aluminum oxide is formed on the outermost surface of the metal layer; second, below this oxide layer is a region of less than 95% Al purity; third, is a layer of 95–98% Al purity; fourth is a layer of 98–100% Al purity; fifth, is a layer of 95–98% Al purity; and sixth is a layer of less than 95% Al purity extending to the Al/polymer substrate interface. In comparison, the low optical density metal layer deposition results in a different set of strata within the metal layer. First, there is a thin layer of aluminum oxide on the outermost surface of the metal layer; second, a region of less than 95% Al purity below this oxide layer; third, a layer of 95–98% Al purity; fourth, a region of less than 95% Al purity extending to the Al/polymer substrate interface. The low optical density metal layer does not contain the highly pure strata of Al which the high optical density metal layer does. Moreover, these bands of highly pure aluminum (95% or greater Al purity) are substantially thicker in the high optical density metal layer compared to the low optical density metal layer. Without being bound to any theory, the applicants believe these relatively thick bands of highly pure aluminum provide for superior oxygen and moisture barrier properties.

In addition, it has been found that the adhesion of the metal layer to the polymer substrate is substantially higher in the case of the high optical density metal layer compared to the low optical density metal layer. This improvement in metal adhesion in combination with high optical density metal layer appears to be correlatable to the amount of nitrogen functional groups at the metal layer/polymer substrate interface formed by the preferred method of discharge treatment in a $N_2$ and $CO_2$ atmosphere. Again, without being bound to any theory, the applicants believe that this improvement in metal layer adhesion found in combination with the high optical density metal layer provides the improved oxygen and moisture barrier durability improvement after elongation and after bag-making.

The heat sealable layer may contain an anti-blocking agent and/or slip additives for good machinability and a low coefficient of friction in about 0.05–0.5% by weight of the heat-sealable layer. The heat sealable layer will preferably comprise a ternary ethylene-propylene-butene copolymer. If the invention comprises a non-heat sealable, winding layer, this layer will comprise a crystalline polypropylene or a matte layer of a block copolymer blend of polypropylene and one or more other polymers whose surface is roughened during the film formation step so as to produce a matte finish on the winding layer. Preferably, the surface of the winding layer is discharge-treated to provide a functional surface for lamination or coating with adhesives and/or inks.

The polyolefin resin is coextruded with the heat sealable layer will have a thickness between 0.2 and 5 $\mu$m, preferably between 0.6 and 3 $\mu$m, and more preferably between 0.8 and 1.5 $\mu$m. The coextrusion process includes a two-layered compositing die. The two layer laminate sheet is cast onto a cooling drum whose surface temperature is controlled between 20° C. and 60° C. to solidify the non-oriented laminate sheet.

The non-oriented laminate sheet is stretched in the longitudinal direction at about 135 to 165° C. at a stretching ratio of about 4 to about 5 times the original length and the resulting stretched sheet is cooled to about 15° C. to 50° C. to obtain a uniaxially oriented laminate sheet. The uniaxially oriented laminate sheet is introduced into a tenter and preliminarily heated between 130° C. and 180° C., and stretched in the transverse direction at a stretching ratio of about 7 to about 12 times the original length and then heat set to give a biaxially oriented sheet. The biaxially oriented film has a total thickness between 6 and 40 $\mu$m, preferably between 10 and 20 $\mu$m, and most preferably between 12 and 18 $\mu$m.

The surface of the polyolefin resin layer of the biaxially oriented laminate film is subjected to discharge treatment, preferably a corona-discharge treatment. The discharge treatment is preferably conducted in an atmosphere of $N_2$ or a mixture of $CO_2$ and $N_2$ more preferably in a mixture of $CO_2$ and $N_2$. The treated laminate sheet is then wonded in a roll. The roll is placed in a metallizing chamber and the metal is vapor-deposited on the discharge treated polyolefin resin layer surface. The metal film may include titanium, vanadium, chromium, maganese, iron, cobalt, nickel, copper, zinc, aluminum, gold, or palladium, the preferred being aluminum. The metallized film is then tested for oxygen and moisture permeability, optical density, metal adhesion, and film durability.

In another embodiment the invention comprises: a polyolefin resin layer; a polymer core layer; a heat sealable layer or non-sealable winding layer formed on the surface of a polymer core layer opposite the polyolefin resin layer; and a metal layer disposed on the polyolefin resin layer. The polymer core layer is sandwiched between the resin layer and the heat sealable layer. In the preferred embodiment, the polyolefin resin layer will contain a polymer additive present in about 1 to 30 percent by weight, preferably 1 to 20 percent by weight, more preferably 1 to 10 percent by weight of the polyolefin mixed resin layer. The polymer additive is selected from a group of synthetic polymer waxes, preferably a polyethylene, crystalline wax. Alternatively, the polymer additive is selected from the group of petroleum resins and/or terpene resins as described in U.S. Pat. No. 5,698, 317. The polyolefin resin layer may optionally contain up to 10 to 10,000 ppm of antiblock additives such as silicas, aluminosilicates, or metal-aluminosilicates. The heat sealable layer or non-sealable winding layer may also contain antiblock components such as silicas, aluminosilicates, or polymeric antiblocks such as crosslinked silicone polymer in the amount of 0.10–0.50% by weight of the heat sealable or non-sealable winding layer. The surface of the polyolefin resin layer is corona-discharge treated, preferably in an atmosphere of $N_2$ and $CO_2$, to give excellent printability and promote adhesion between the polyolefin resin layer and the metal layer.

A metal layer is deposited on the discharge treated polyolefin resin layer. The metal layer is preferably a vapor deposited metal, more preferably vapor deposited aluminum. The metal layer shall have a thickness of about 5 to 100 nm, and an optical density between 2.6 and 5.

In a particular embodiment, a laminate film of the invention comprises the following material components, and is made according to the following procedure. A propylene polymer resin and a polyethylene wax having a molecular weight of about 3000, a viscosity of about 110 cp at 149° C., and a melting point of about 129° C. are blended together. In the preferred embodiment, a crystalline, propylene polymer resin is blended with a crystalline, linear, polyethylene wax. Optionally, a relatively small amount (about 100–1000 ppm) of an antiblock additive, preferably sodium calcium aluminosilicate powder having a mean particle diameter of about 3 $\mu$m is added to the polymer blend. The mixture is then extruded to form a polyolefin mixed resin film with a thickness of 0.75 $\mu$m.

The polyolefin mixed resin film is coextruded with a polymer core layer, preferably a polypropylene core layer, having a thickness between 5 and 36 $\mu$mm preferably between 10 and 20 μm, and more preferably between 10 and 15 μm, and a heat sealable layer opposite the mixed resin layer having a thickness between 0.2 and 5 μm, preferably between 0.6 and 3 μm, and more preferably between 0.8 and 1.5 μm. The coextrusion process includes a three-layered compositing die. The polymer core layer is sandwiched between the polyolefin mixed resin layer and the heat sealable layer. The three layer laminate sheet is cast onto a cooling drum whose surface temperature is controlled between 20° C. and 60° C. to solidify the non-oriented laminate sheet.

The non-oriented laminate sheet is stretched in the longitudinal direction at about 135 to 165° C. at a stretching ratio of about 4 to about 5 times the original length and the resulting stretched sheet is cooled to about 15° C. to 50° C. to obtain a uniaxially oriented laminate sheet. The uniaxially oriented laminate sheet is introduced into a tenter and preliminarily heated between 130° C. and 180° C. , and stretched in the transverse direction at a stretching ratio of about 7 to about 12 times the original length and then heat set to give a biaxially oriented sheet. The biaxially oriented film has a total thickness between 6 and 40 μm, preferably between 10 and 20 μm, and most preferably between 12 and 18 μm.

The surface of the polyolefin mixed resin layer of the biaxially oriented laminate film is subjected to a discharge treatment, preferably a corona discharge treatment. The discharge treatment is preferably conducted in an atmosphere of $N_2$ or a mixture of $N_2$ and $CO_2$, preferably in an atmosphere of $N_2$ and $CO_2$. The treated laminate sheet is then wound in a roll. The roll is placed in a metallizing chamber and aluminum was vapor-deposited on the discharge-treated polyolefin mixed resin layer surface. The metal film may comprise any first row transition metal, aluminum, gold, or palladium, the preferred being aluminum. The metallized film is then tested for oxygen and moisture permeability, optical density, metal adhesion, and film durability.

This invention will be better understood with reference to the following examples, which are intended to illustrate specific embodiments within the overall scope of the invention.

EXAMPLE 1

One hundred parts by weight of a crystalline propylene homopolymer resin; 0.0001 parts by weight of a sodium calcium aluminosilicate powder or an amorphous silica having a mean particle diameter of 3 μm, were blended together. This mixture was coextruded with a heat sealable ternary ethylene-propylene-butene copolymer containing 4000 ppm of a crosslinked silicone polymer of mean particle diameter of 2 μm by weight of the heat sealable layer, and biaxially oriented to produce a 2-layer film where the propylene homopolymer resin layer was 16 μm thick and the accompanying coextruded ternary ethylene-propylene-butene copolymer layer was 1.5 μm thick. The total oriented film thickness was 17.5 μm or 70G or 0.7 mil thick. The film was then discharge-treated in a controlled atmosphere of $N_2$ and $CO_2$, on the propylene homopolymer side (the metallizing surface) and wound in roll form. The roll was then metallized by vapor-deposition of aluminum onto the discharge-treated surface to an optical density target of 2.8–3.0. The metallized laminate film was then tested for oxygen and moisture permeability, optical density, metal adhesion, and film durability.

EXAMPLE 2

One hundred parts by weight of a crystalline propylene homopolymer resin; 5 parts by weight of a crystalline linear polyethylene wax having a molecular weight of 3000, a viscosity of 110 cp at 149° C. and a melting point of 129° C.; and 0.00015 parts by weight of a sodium calcium aluminosilicate powder having a mean particle diameter of 3 μm, were blended together. The mixture was then extruded to form a polyolefin mixed resin film with a thickness 0.75 μm. The polyolefin mixed resin film is coextruded with a propylene homopolymer core layer having a thickness 13.25 μm, and a heat sealable layer opposite the mixed resin layer having a thickness 1.0 μm. The three layer film is coextruded so as to from a biaxially oriented film with a total thickness of 15 μm. The film was then discharge-treated in a controlled atmosphere of $N_2$ and $CO_2$ on the polyolefin mixed resin layer side (the metallizing surface) and wound in roll form. The roll was then placed in a metallizing chamber and aluminum was vapor-deposited on the discharge-treated polyolefin mixed resin layer surface to an optical density target of 2.8–3.0 The metallized laminate film was then tested for oxygen and moisture permeability, optical density, metal adhesion, and film durability.

EXAMPLE 3

A process similar to Example 2 was repeated except that 12.5% by weight of a polydicyclopentadiene petroleum resin was used in place of the crystalline linear polyethylene wax in the polyolefin mixed resin metallizing layer.

COMPARATIVE EXAMPLE 1

A process similar to Example 1 was repeated except that an optical density target of 2.0–2.6 was used for the vapor-deposited aluminum layer.

COMPARATIVE EXAMPLE 2

A process similar to Example 2 was repeated except that an optical density target of 2.0–2.6 was used for the vapor-deposited aluminum layer.

COMPARATIVE EXAMPLE 3

A process similar to Example 3 was repeated except that an optical density target of 2.0–2.6 was used for the vapor-deposited aluminum layer.

COMPARATIVE EXAMPLE 4

A process similar to Example 1 was repeated except that the discharge treatment method was conducted in an atmosphere of air instead of $N_2$ and $CO_2$.

WORKING EXAMPLE I

The various properties in the above examples were measured by the following methods:

A) Oxygen transmission rate of the film was measured by using a Mocon Oxtran 2/20 unit substantially in accordance with ASTM D3985. In general, the preferred value was an average value equal to or less than 15.5 cc/m²/day with a maximum of 46.5 cc/m²/day.

B) Moisture transmission rate of the film was measured by using a Mocon Permatran 3/31 unit measured substantially in accordance with ASTM F1249. In general, the preferred value was an average value equal to or less than 0.155 g/m²/day with a maximum of 0.69 g/m²/day.

C) Optical density was measured using a Tobias Associates model TBX transmission densitometer. Optical density is defined as the amount of light reflected from the test specimen under specific conditions. Optical density is reported in terms of a logarithmic conversion. For example, a density of 0.00 indicates that 100% of the light falling on the sample is being reflected. A density of 1.00 indicates that 10% of the light is being reflected; 2.00 is equivalent to 1%, etc.

D) Metal adhesion was measured by adhering a strip of 1-inch wide 610 tape to the metallized surface of a single sheet of metallized film and removing the tape from the metallized surface. The amount of metal removed was rated qualitatively as follows:

4.0=0–5% metal removed 3.5=6–10% metal removed 3.0=11–20% metal removed 2.5=21–30% metal removed 2.0=31–50% metal removed 1.5=51–75% metal removed 1.0=76–100% metal removed In general, preferred values ranged from 3.0–4.0.

E) Barrier durability of the film was measured by elongating test specimens in an Instron Tensile tester at 9 % elongation. The elongated sample was then measured for barrier properties using Mocon Oxtran 2/20 or Permatran 3/31 units. In general, preferred values of $O_2TR$ (oxygen transmission rate), which is a measurement of the permeation rate of oxygen through a substrate, would be equal or less than 46.5 cc/m$^2$/day up to 9% elongation and MVTR (moisture vapor transmission rate), which is a measurement of the permeation rate of water vapor through a substrate, would be equal or less than 0.69 g/m$^2$/day up to 9% elongation.

F) Surface chemistry of the discharge-treated surface was measured using ESCA surface analysis techniques. A Physical Electronics model 5700LSci X-ray photoelectron/ESCA spectrometer was used to quantify the elements present on the sample surface. Analytical conditions used a monochromatic aluminum x-ray source with a source power of 350 watts, an exit angle of 50°, analysis region of 2.0 mm×0.8mm, a charge correction of C—(C,H) in C 1s spectra at 284.6 eV, and charge neutralization with electron flood gun. Quantitative elements such as O, C, N were reported in atom %.

G) Depth profiling and composition of the metal layer was measured using ESCA surface analysis techniques. A Physical Electronics model 5700LSci X-ray photoelectron/ESCA spectrophotometer was used to high resolution depth profiles of O, C, and Al using a 3kV Ar$^+$ beam. Analytical conditions used a monochromatic aluminum x-ray source with a source power of 350 watts, a take-off angle of 65°, analysis region of 0.8mm diameter, a charge correction of C—(C,H) in C 1s spectra at 284.6 eV, charge neutralization with electron flood gun, ion sputtering of 3 kV Ar$^+$, and $SiO_2$ sputter rate of 48A/min for $SiO_2$.

Figure 1B:
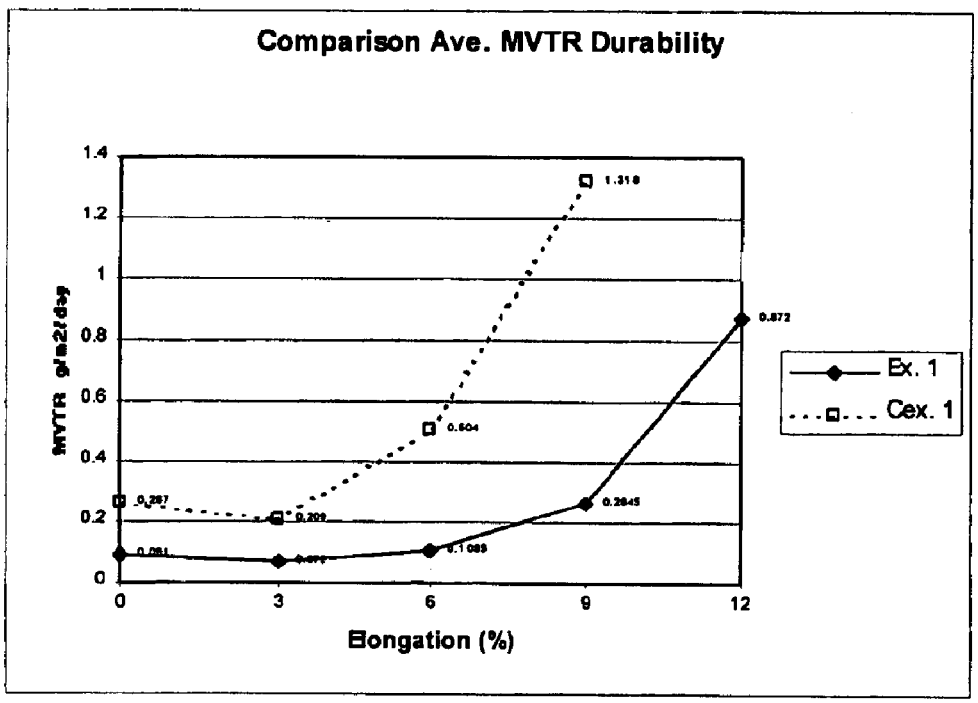

The results of the foregoing examples ("Ex.") and comparative example ("CEx.") are shown in Tables 1 and 2, and FIGS. 1a and 1b.

TABLE 1

|  | Optical Density | O2TR (38C/0%RH) cc/m2/day | MVTR (23C/90%RH) g/m2/day | Metal Adhesion 1–4 (1 = poor: 4 = best) |
|---|---|---|---|---|
| Ex. 1 | 3.04 | 9.87 | 0.078 | 3.0–4.0 |
| Ex. 2 | 3.08 | 9.4 | 0.088 | 3.5–4.0 |
| Ex. 3 | 2.82 | 17.9 | 0.124 | 3.0–4.0 |
| C Ex. 1 | 2.31 | 25.4 | 0.264 | 1.5–2.0 |
| C Ex. 2 | 2.53 | 28.8 | 0.200 | 2.5 |
| C Ex. 3 | 2.47 | 30.4 | 0.207 | 2.0 |
| C Ex. 4 | 3.20 | 13.8 | 0.058 | 1.5–2.0 |

TABLE 2

|  | Optical Density | 9% Elongation O2TR (38 C./0% RH) cc/m2/day | 9% Elongation MVTR (23 C./90% RH) g/m2/day | Formed Bag O2TR (38 C./0% RH) cc/m2/day | Formed Bag MVTR (23 C./90% RH) g/m2/day | Metal Adhesion 1–4 (1 = poor, 4 = best) | % N-func'l @ interface atom, % |
|---|---|---|---|---|---|---|---|
| Ex. 1 | 3.04 | 27.0 | 0.151 | 10.2 | 0.054 | 3.0–4.0 | 0.6 |
| CEx. 1 | 2.31 | 154 | 1.02 | 144 | 0.744 | 1.5–2.0 | 0.7 |
| CEx. 4 | 3.20 | 76.3 | 0.450 | 63.3 | 0.462 | 1.5–2.0 | 0.2 |

We claim:

1. A laminate film comprising:
    a polyolefin resin layer having a discharge-treated surface on one side of said polyolefin resin layer comprising at least 0.3% nitrogen functional groups on said discharge-treated surface; and
    a metal layer having an optical density of at least about 2.6 deposited on said discharge-treated surface of said polyolefin resin layer,
    wherein said discharge-treated surface is formed in an atmosphere consisting essentially of $CO_2$ and $N_2$ to form said nitrogen functional groups and wherein the laminate film has a barrier durability at 9% elongation of 46.5 cc/m$^2$/day or less oxygen transmission rate through the laminate film.

2. The laminate film of claim 1, further comprising:
    a heat sealable layer or winding layer comprising an antiblock component selected from the group consisting of amorphous silicas, aluminosilicates, sodium calcium aluminum silicate, a crosslinked silicone polymer and polymethylmethacrylate, wherein the heat sealable layer or winding layer is on another side of said polyolefin resin layer than said discharge-treated surface.

3. A laminate film comprising:
    a first polyolefin resin layer having a first surface and a second surface;
    a second polyolefin resin layer that is disposed on the first surface of said first polyolefin resin layer having a discharge-treated surface on said second polyolefin resin layer disposed on the side opposite that of the first polyolefin layer comprising at least about 0.3% nitrogen functional groups on said discharge-treated surface;

a metal layer having an optical density of at least about 2.6 deposited on said second polyolefin resin layer; and a heat sealable layer or a winding layer disposed on the second surface of said first polyolefin resin layer, wherein said discharge-treated surface is formed in an atmosphere consisting essentially of $CO_2$ and $N_2$ to form said nitrogen functional groups and wherein the laminate film has a barrier durability at 9% elongation of 46.5 $cc/m^2/day$ or less oxygen transmission rate through the laminate film.

4. The laminate film according to claim 1, wherein said polyolefin resin layer has a thickness of about 6 to 40 $\mu m$.

5. The laminate film of claim 1, wherein said polyolefin resin layer comprises a polypropylene resin.

6. The laminate film of claim 2 or 3, wherein said heat-sealable layer or winding layer has a thickness of about 0.5 to 5.0 $\mu m$.

7. The laminate film of claim 2 or 3, wherein said heat sealable or winding layer comprises an anti-blocking agent of about 0.05 to 0.5 percent by weight of said heat sealable or winding layer.

8. The laminate film of claim 2 or 3, wherein said heat sealable layer comprises a ternary ethylene-propylene-butene copolymer.

9. The laminate film of claim 2 or 3, wherein said winding layer comprises a crystalline polypropylene or a matte layer of a block copolymer blend of polypropylene and one or more other polymers having a roughened surface.

10. The laminate film of claim 2 or 3, wherein said winding layer comprises a treated surface for lamination or coating with adhesives or inks.

11. The laminate film of claim 1, 2 or 3, wherein said metal layer has a thickness of about 5 to 100 nm.

12. The laminate film of claim 1, 2 or 3, wherein said metal layer has an optical density of about 2.6 to 5.0.

13. The laminate film of claim 1, 2 or 3, wherein said metal layer comprises aluminum.

14. The laminate film of claim 3, wherein said second polyolefin resin layer comprises additives that enhance metal adhesion or metal formation.

15. The laminate film of claim 3, wherein said second polyolefin resin layer has a thickness of about 0.2 to 5.0 $\mu m$.

16. The laminate film of claim 3, wherein said second polyolefin resin layer comprises a polypropylene resin.

17. The laminate film of claim 14, wherein said second polyolefin resin layer comprises an additive selected from the group consisting of petroleum resins and terpene resins.

18. The laminate film of claim 17, wherein the additive comprises about 5 to 30 percent by weight of said second polyolefin resin layer.

19. The laminate film of claim 14, wherein said second polyolefin resin layer comprises an additive selected from the group consisting of linear crystalline polyethylene waxes, branched polyethylene waxes, hydroxyl-terminated polyethylene waxes, and carboxyl-terminated polyethylene waxes.

20. The laminate film of claim 19, wherein the additive comprises about 1 to 15 percent by weight of said second polyolefin resin layer.

21. The laminate film of claim 1, 2 or 3, wherein said metal layer comprises:

a layer of aluminum oxide of about 30 Å thick;

an aluminum-enriched layer comprising at least about 95% aluminum of about 200–500 Å total thickness; and an aluminum-enriched layer of at least about 98% aluminum of about 50–150 Å thickness.

22. A laminate film comprising:

a polyolefin resin layer having a discharge-treated surface; and a metal layer having an optical density of at least about 2.6 deposited on said discharge-treated surface;

wherein said discharge-treated surface is formed in an atmosphere consisting essentially of $CO_2$ and $N_2$ to form said nitrogen functional groups and wherein the laminate film has a barrier durability at 9% elongation of 46.5 $cc/m^2/day$ or less oxygen transmission rate through the laminate film.

23. The laminate film of claim 22, further comprising a heat sealable layer or winding layer comprising an antiblock component selected from the group consisting of amorphous silicas, aluminosilicates, sodium calcium aluminum silicate, a crosslinked silicone polymer and polymethylmethacrylate, wherein the heat sealable layer or winding layer is on another side of said polyolefin resin layer.

24. The laminate film according to claim 22, wherein said polyolefin resin layer has a thickness of about 6 to 40 $\mu m$.

25. The laminate film of claim 22, wherein said polyolefin resin layer comprises a polypropylene resin.

26. A laminate film comprising:

a first polyolefin resin layer having a first surface and a second surface;

a second polyolefin resin layer that is disposed on the first surface of said first polyolefin resin layer;

a metal layer having an optical density of at least about 2.6 deposited on said second polyolefin resin layer; and a heat sealable layer or a winding layer disposed on the second surface of said first polyolefin resin layer, wherein said discharge-treated surface is formed in an atmosphere consisting essentially of $CO_2$ and $N_2$ to form said nitrogen functional groups and wherein the laminate film has a barrier durability at 9% elongation of 46.5 $cc/m^2/day$ or less oxygen transmission rate through the laminate film.

27. The laminate film of claim 23 or 26, wherein said heat-sealable layer or winding layer has a thickness of about 0.5 to 5.0 $\mu m$.

28. The laminate film of claim 23 or 26, wherein said heat sealable or winding layer comprises an anti-blocking agent of about 0.05 to 0.5 percent by weight of said heat sealable or winding layer.

29. The laminate film of claim 23 or 26, wherein said heat sealable layer comprises a ternary ethylene-propylene-butene copolymer.

30. The laminate film of claim 23 or 26, wherein said winding layer comprises a crystalline polypropylene or a matte layer of a block copolymer blend of polypropylene and one or more other polymers having a roughened surface.

31. The laminate film of claim 23 or 26, wherein said winding layer is treated to provide a surface for lamination or coating with adhesives or inks.

32. The laminate film of claim 22, 23 or 26, wherein said metal layer has a thickness of about 5 to 100 nm.

33. The laminate film of claim 22, 23 or 26, wherein said metal layer has an optical density of about 2.6 to 5.0.

34. The laminate film of claim 22, 23 or 26, wherein said metal layer comprises aluminum.

35. The laminate film of claim 26, wherein said second polyolefin resin layer comprises additives that enhance metal adhesion or metal formation.

36. The laminate film of claim 26, wherein said second polyolefin resin layer has a thickness of about 0.2 to 5.0 μm.

37. The laminate film of claim 26, wherein said second polyolefin resin layer comprises a polypropylene resin.

38. The laminate film of claim 35, wherein said second polyolefin resin layer comprises an additive selected from the group consisting of petroleum resins and terpene resins.

39. The laminate film of claim 38, wherein the additive comprises about 5 to 30 percent by weight of said second polyolefin resin layer.

40. The laminate film of claim 35, wherein said second polyolefin resin layer comprises an additive selected from the group consisting of linear crystalline polyethylene waxes, branched polyethylene waxes, hydroxyl-terminated polyethylene waxes, and carboxyl-terminated polyethylene waxes.

41. The laminate film of claim 40, wherein the additive comprises about 1 to 15 percent by weight of said second polyolefin resin layer.

42. The laminate film of claim 22, 23 or 26, wherein said metal layer comprises:
  a layer of aluminum oxide of about 30 Å thick;
  an aluminum-enriched layer comprising at least about 95% aluminum of about 200–500 Å total thickness; and
  an aluminum-enriched layer of at least about 98% aluminum of about 50–150 Å thickness or more.

* * * * *

UNITED STATES PATENT AND TRADEMARK OFFICE
CERTIFICATE OF CORRECTION

PATENT NO. : 6,916,526 B1
DATED : July 12, 2005
INVENTOR(S) : Keunsuk P. Chang et al.

It is certified that error appears in the above-identified patent and that said Letters Patent is hereby corrected as shown below:

<u>Column 4,</u>
Line 9, replace "wonded" with -- wound --.
Line 13, replace "maganese" with -- manganese --.

<u>Column 5,</u>
Line 32, replace "was" with -- is --.

Signed and Sealed this

Twenty-eighth Day of March, 2006

JON W. DUDAS
*Director of the United States Patent and Trademark Office*